United States Patent [19]

Cawston et al.

[11] Patent Number: 4,628,023
[45] Date of Patent: Dec. 9, 1986

[54] METAL ION FREE PHOTORESIST DEVELOPER COMPOSITION WITH LOWER ALKYL QUATERNARY AMMONIUM HYDROZIDE AS ALKALAI AGENT AND A QUATERNARY AMMONIUM COMPOUND AS SURFACTANT

[75] Inventors: John F. Cawston, Winchester; Paul E. Becker, Norwood, both of Mass.

[73] Assignee: Shipley Company Inc., Newton, Mass.

[21] Appl. No.: 846,824

[22] Filed: Mar. 31, 1986

Related U.S. Application Data

[63] Continuation of Ser. No. 485,409, Apr. 15, 1983, abandoned, which is a continuation-in-part of Ser. No. 252,915, Apr. 10, 1981, abandoned.

[51] Int. Cl.$^4$ .................... G03C 5/24; G03C 5/34
[52] U.S. Cl. ......................... 430/331; 430/309; 430/326; 252/156; 252/528; 252/529; 252/541; 252/547; 252/548
[58] Field of Search ............. 430/331, 309, 325, 326; 252/547, 541, 548, 528, 529, 156

[56] References Cited

U.S. PATENT DOCUMENTS

| | | | |
|---|---|---|---|
| 3,046,114 | 7/1962 | Sas | 430/331 |
| 4,141,733 | 2/1979 | Guild | 430/326 |
| 4,191,573 | 3/1980 | Toyoma et al. | 430/167 |
| 4,239,661 | 12/1980 | Muraoka et al. | 252/547 |
| 4,267,260 | 5/1981 | Miura et al. | 430/331 |
| 4,291,119 | 9/1981 | Ohishi et al. | 430/331 |
| 4,294,911 | 10/1981 | Guild | 430/331 |
| 4,302,364 | 11/1981 | Gosset et al. | 252/548 |
| 4,311,618 | 1/1982 | Burkhard | 252/548 |
| 4,333,862 | 6/1982 | Smith et al. | 252/547 |
| 4,411,981 | 10/1983 | Minezaki | 430/326 |
| 4,423,138 | 12/1983 | Guild | 430/326 |

FOREIGN PATENT DOCUMENTS 1367830 9/1974 United Kingdom .............. 430/331

OTHER PUBLICATIONS

English Translation of Japanese Patent Publication No. 56226/1976, 430-331, 5/1976.
Research Disclosure, #18620, 10/1979, pp. 575–576.
IBM Tech. Disclosure Bulletin, vol. 13, No. 7, 10/1970, p. 2009.
Abstract No. 354, Electrochem. Soc. Fall Meeting, 1976, "Application of Chloline in Semiconductor Technology".

*Primary Examiner*—Charles L. Bowers, Jr.
*Attorney, Agent, or Firm*—Robert L. Goldberg

[57] ABSTRACT

An aqueous metal ion-free developer composition for developing photoresists comprising a metal ion-free alkali and a metal ion-free surfactant that is a quaternary ammonium compound. The developer permits a reduction of from 20–50% in the energy necessary to expose the photoresist without deleterious effect on image quality and image resolution.

12 Claims, No Drawings

METAL ION FREE PHOTORESIST DEVELOPER COMPOSITION WITH LOWER ALKYL QUATERNARY AMMONIUM HYDROZIDE AS ALKALAI AGENT AND A QUATERNARY AMMONIUM COMPOUND AS SURFACTANT

CROSS REFERENCE TO RELATED APPLICATIONS

This is a continuation of co-pending application Ser. No. 06/485,409 filed on Apr. 15, 1983, now abandoned which in turn is a continuation-in-part of copending U.S. patent application Ser. No. 252,915, filed Apr. 10, 1981 now abandoned.

INTRODUCTION

This invention relates to novel aqueous alkaline developer compositions for photosensitive resists and the use thereof. More specifically, it relates to high speed resolution developer compositions which are metal ion-free.

BACKGROUND OF THE INVENTION

In the manufacture of integrated circuit devices, printed circuit boards, printing plates, and in related arts, resist processes are used whereby photochemical images are formed on a substrate to protect selected portions of the substrate during subsequent manufacturing processes such as, for example, etching, metal deposition, and diffusion processes. The resist processes employ radiation sensitive organic compositions which are coated onto the substrate surface and then exposed patternwise to light or other suitable actinic radiation such as, for example, x-rays, gamma rays, or an electron beam. The exposed resist layer is then developed by methods known in the art and the portions of the substrate which are bared by development can then be treated.

Both positive and negative working photoresists are known. A positive resist is composed typically of a base-soluble binder such as a phenol-formaldehyde novolak resin and a sensitizer, that is, a photoactive compound, such as a diazo compound. Such sensitizers and resists are described, for example, in U.S. Pat. Nos. 3,046,118; 3,046,121; 3,106,465; 3,201,239; 3,666,473; 4,009,033 and 4,093,461 which are each incorporated herein by reference.

In manufacturing processes employing photoresists, the rate of production is dependent upon the time required to form the photomechanical image which, in turn, depends in part on the time required to expose the resist to the necessary amount of activating radiation and on the time required to then develop the latent image-bearing resist. Accordingly, four interrelated factors determine the rate of product through-put: radiation intensity and exposure time, and developing solution concentration and solution contact time.

Typically, exposed resists will dissolve in developer solution of a given concentration at a certain rate. This is true whether development is by immersion or by puddle or spray techniques. Generally, solution contact time is pre-set. The minimum necessary exposure time to achieve complete development of the photoresist is then determined, often by trial and error. Underexposure of the photoresist generally cannot be effectively off-set by using developing solution above the recommended concentration since this normally will result in significant loss of selectivity. That is, a greater portion of unexposed resist will be dissolved along with the exposed portion. Consequently, there is a disadvantageous loss of resolution in the photomechanical image and, therefore, in the quality of the subsequently treated image. Accordingly, in a typical manufacturing process employing a source of actinic radiation of certain intensity, the proper exposure time is determined by first setting the time longer than necessary and decreasing it incrementally until the photomechanical image is just developed during the pre-set solution contact time. Thus, for example, where development is by immersion for 60 seconds in a developing solution, the exposure time is adjusted downward until development is just completed in the 60 second immersion time.

A significant disadvantage inherent in the use of known developers relates to metal ion contamination of the work piece, especially integrated circuit devices and the like. The ever smaller lines and spaces being used for the circuitry of such devices make it necessary that there be no contamination by current carrying metal ions, since the functional properties of the device could be affected.

Known developers comprise metal ions and thus can cause metal ion contamination. Inadequate rinsing of the device after development of the photomechanical image can result in metal ion contamination and this is especially troublesome with automatic in-line developing methods, in which there is no immersion rinse. Metal ion contamination can cause failure of finished IC devices.

SUMMARY OF THE INVENTION

According to the present invention, the foregoing objects are achieved by a novel metal ion free developer composition. More specifically, the invention provides an aqueous metal ion free developer composition comprising a metal ion free alkali and a metal ion free surfactant comprising one or more quaternary ammonium compounds as defined below.

According to a method aspect of the invention, there is provided a method of developing a photoresist by contacting it with the above-described aqueous metal ion-free developer composition.

The developer composition of the invention provides a significant advance in the art in that the exposure energy required to form the photomechanical resist image is typically reduced by as much as 20 percent and frequently reduced by as much as 40 to 50 percent. Yet, image quality and resolution are substantially improved over that obtained by the use of known developers. The developer composition of the invention also results in minimal image distortion.

DETAILED DESCRIPTION

The present invention provides a novel aqueous alkaline developer for photoresist. It operates preferably at a temperature of approximately 10° to 30° C., more preferably at about 20° C. or room temperature.

The developer composition of the invention can be used in any manner suitable for known developers. Thus, immersion, spray, and puddle techniques can be used. The photoresist to be developed is generally applied to a substrate, image-wise exposed to actinic radiation and subsequently contacted with the developer. Development of the photomechanical image typically requires about 60 seconds if by immersion, less if by spray or puddle techniques. Subsequent to development, the work piece can then be rinsed and further processed as desired.

Metal ion-free alkali suitable for use in the novel developer composition of the invention are usually, but not necessarily, water soluble and must provide the necessary alkalinity. The novel developer composition of the invention is operative at a pH between about 11 to 14, but most preferably operative between about 12.5 and 13. Below about pH 11, there is significant decrease in the speed of development.

Suitable sources of alkali include, for example, aryl and alkyl amines including primary, secondary and tertiary substituted amines, wherein the substituents can be straight, branched or cyclic. Suitable amines include, for example, alkylene diamines such as, for example, 1,3-diamino propane, and aryl amines, for example, 4,4diamino diphenylamine. Also suitable are imines, for example, BIS-(dialkylamino)imine. Preferably, alkyl substituents comprise from 1 to 12 carbon atoms. Preferred aryl substituents include phenyl and phenalkyl. Also suitable as a source of alkali is a heterocyclic base, such as, for example, those comprising a ring having 3 to 5 carbon atoms with 1 or 2 heteroatoms selected from N, O, and S, for example, pyrrole, pyrollidine, pyrollidone, pyridine, morpholine, pyrazine, piperidine, oxazole and thiazole. Another suitable source of alkali is the quaternary ammonium bases such as, for example, the lower alkyl quaternary ammonium hydroxides and the like. Preferred alkali include tetraalkylammonium hydroxides, wherein each alkyl substituent is the same or different and has from 1 to 3 carbons. Tetramethylammonium hydroxide is most preferred.

The metal ion-free surfactant of the developer composition of the invention differs from the source of alkalinity and comprises one or preferably, a mixture of quaternary ammonium compounds having the general formula:

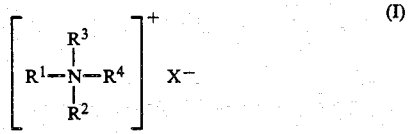
(I)

wherein $R^1$ comprises a saturated or unsaturated, straight or branched hydrocarbon chain having from 6 to 20 carbons, and from zero to 3 oxygens, provided that each oxygen can be separated from others by at least one carbon, and which is alkoxy-substituted or unsubstituted;

$R^2$ and $R^3$ are the same or different and each comprises alkyl of from 1 to 3 carbons; or $(R^5O)_nH$ wherein $R^5$ is alkylene of 1 to 3 carbons and n is an integer of from 1 to 20; or $R^2$ and $R^3$ together comprise a cycloaliphatic hydrocarbon of from 2 to 8 carbons with from zero to 2 heteroatoms selected from O, N, and S, provided that each heteroatom be separated from another and from the quaternary nitrogen by at least one carbon; or $R^2$ and $R^3$ together comprise a cycloaromatic hydrocarbon of from 2 to 8 carbons with from zero to two nitrogen heteroatoms, provided that each nitrogen atom be separated from another and from the quaternary nitrogen by at least one carbon;

$R^4$ comprises a saturated or unsaturated, straight or branched hydrocarbon having from 1 to 10 carbon atoms, $(R^5O)_nH$ is as defined above, phenalkyl, wherein the alkyl moiety has from 0 to 3 carbons, or

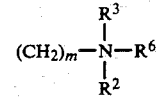

wherein m is from 1 to 4, $R^2$ and $R^3$ are as defined above, and $R^6$ is saturated or unsaturated, straight or branched hydrocarbon having from 1 to 10 carbon atoms or $(R^5O)_nH$ as defined above, or phenylalkyl having an alkyl group of from 0 to 3 carbon atoms; and X comprises halo, hydroxy, or silicate, or the corresponding amino acids of said quaternary ammonium compounds.

Preferably, there are in $R^2$, $R^3$, and $R^4$, in total, no more than 15 alkoxy units, $(R^5O)$, most preferably, no more than 2.

Preferred for use in the invention are quaternary ammonium compounds having the general formula II:

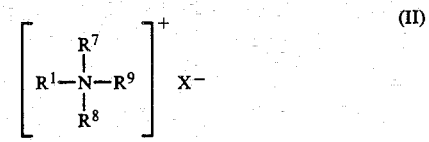
(II)

wherein $R^1$ and X are defined for Formula I;

$R^7$ and $R^8$ are the same or different and each comprises alkyl of from 1 to 3 carbons, or $(R^5O)_nH$ wherein n is 1 and $R^5$ is as defined for Formula I; and $R^9$ comprises a saturated or unsaturated, straight, branched or cyclic hydrocarbon having from 1 to 10 carbons, $(R^5O)_nH$ wherein n is 1 and $R^5$ is defined for Formula I, phenalkyl wherein the alkyl moiety has from 0 to 3 carbons, or

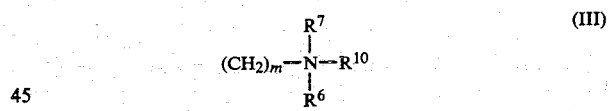
(III)

wherein m is from 1 to 4, $R^6$ and $R^7$ are as defined above, and $R^{10}$ is saturated or unsaturated, straight or branched hydrocarbon having from 1 to 10 carbon atoms, or $(R^5O)_nH$ as defined above or phenalkyl having an alkyl group of from 0 to 3 carbon atoms.

Metal ion free developers according to the invention, comprising one or more surfactants of Formula II above, have been found more selective in developing exposed areas of photoresist, and to have little or no attack on the unexposed photoresist. A metal ion free developer, made according to the invention, markedly reduces the required exposure time to create the required image by at least 20% and frequently from 40 to 50% and thus increases wafer throughout.

By comparison, using known developers, a reduction of exposure time by 40 to 50% cannot be achieved even by using a bath of increased concentration, because of attack on the unexposed photoresist. Thus, known developers show much less selectivity between exposed and unexposed areas.

Among the preferred surfactants are those comprising ethoxylated quaternary ammonium compounds having the general formula:

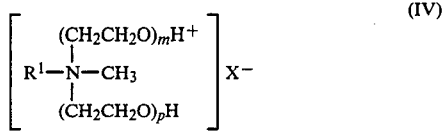

wherein
m and p are each 1 or 2 and $R^1$ is alkyl of from 8 to 18 carbon atoms in approximately the following proportions:

TABLE I

| $R^1$ carbon chain length | % |
| --- | --- |
| $C_8$ | 5 |
| $C_{10}$ | 6 |
| $C_{12}$ | 51 |
| $C_{14}$ | 19 |
| $C_{16}$ | 9 |
| $C_{18}$ | 5 |

Most preferably, such surfactants comprise ethoxylated quaternary ammonium compounds wherein m and p are each 1, that is, methylbis-(2-hydroxyethyl)cocoammonium chloride. Such surfactants can be derived from coconut oil, and one such is commercially available under the trademark "ETHOQUAD C/12" (Armak Co., Pasadena, Tex., sold as a 75% active solution).

Also preferred are the compounds of the Formula I wherein $R^2$, $R^3$ and $R^4$ are alkyl of 1 to 3 carbon atoms, most preferably methyl, and $R^1$ is as defined in Formula IV. Most preferred of such surfactants is trimethylcocoammonium chloride, which surfactant can be derived from coconut oil and is commercially available under the trademark "ARQUAD C-50" (Armak Co., Pasadena, Tex., sold as a 50% active solution).

Another preferred surfactant comprises a mixture of two compounds, one conforming to Formula IV where $R^1$ has 12 carbon atoms and m and p total 15 and the second wherein $R^1$ is 90% $C_{18}$ and 10% $C_{16}$. This surfactant is available under the trademark "ETHOQUAD 18/25" (Armak Co., Pasadena, Tex., sold as a 90% active solution).

The amount of such surfactant employed in the developer composition of the invention will depend in part upon the quaternary ammonium compound(s) chosen and the particular application for which it is used, but is generally used in an amount sufficient to reduce the exposure energy by at least 20% compared to a developer free of said surfactant. Thus, for example, if the surfactant comprises ETHOQUAD C/12, described above, and the alkali is tetramethylammonium hydroxide ("TMAH"), the total amount used is from 0.02 to 45 grams of active C/12 per kgm TMAH, and more preferably, from about 0.1 to 7.5 grams of active C/12 per kgm of TMAH. In one most preferred embodiment, from about 0.2 to 10 grams of active ETHOQUAD C/12 is used in conjunction with from about 1 to 4 grams of active ETHOQUAD 18/25 per kgm TMAH.

The quaternary ammonium compounds, one or more of which comprises the surfactant of the developer compositions, can be readily prepared according to methods well known to those skilled in the art. Alternatively, many suitable compounds, or preferably, mixtures of compounds, are readily commercially available.

While not intending to be bound by theory, it is believed that the newly discovered efficacy of the compounds of Formula I results from their ability to reduce the surface tension of the developer bath at the interface with the photoresist. Thus, there is improved wetting of the exposed photoresist with the developer continuously through the development of the photomechanical image. In this way, the alkali of the developer has better contact and thus more effective action on the acids of the exposed portions of the resist.

It is theorized that such ability to reduce surface tension stems in large part from the affinity of the hydrophobic $R^1$ moiety for the polymeric resin of the photoresist. In this regard, it is further theorized that surfactants comprising a mixture of such compounds, wherein the length of the $R^1$ carbon chain varies, are especially efficatious because the rein system typically also comprises carbon chains of varied length. For example, in the case of a novolak resin there are different novolak resin structures. Thus, different $R^1$ chain lengths provide the greatest affinity and hence the greatest wetting action for each of those different structures. Thus, a synergistic effect is achieved through the combined action of the different length $R^1$ carbon chains.

In addition to the alkali and surfactant described above, the developer composition of the invention may further comprise one or more suitable polyhydric compounds. Suitable polyhydric compounds for use in aqueous alkaline developers are known to the skilled of the art and include glycerol, ethylene glycol and polyglycols and glycol ethers. Glycerol is preferred. Amounts up to about 35 grams per liter of glycerol have been found to be particularly suitable. Preferably, an amount of about 25 to 30 grams per liter is used, most preferably about 27 grams per liter.

The present invention provides a novel metal ion-free, high speed developer suitable for development of positive type photoresists. It is believed to be suitable for etching unsensitized polyamide films in two-layer processing. It is particularly effective for development of positive photoresist containing diazo-type sensitizer, such as 1-oxo-2-diazo-naphthalene-5sulfonate ester in a novolak resin system. Such positive-type photoresists include, for example, the AZ 1300 series and AZ 1400 series photoresists marketed by Shipley Company Inc. of Newton, Mass. The developer of the invention is also highly effective for development of such photoresists containing different sensitizers, for example, 1-oxo-2-diazonaphthalene-4-sulfonate ester or other photoactive materials known to the skilled of the art.

The developer dissolves those portions of such photoresists which have been exposed to actinic radiation, with improved selectivity. That is, even when the amount of exposure energy is reduced, the developer composition of the invention will dissolve the exposed portion(s) with less attack on the unexposed portion(s) than known developers. Thus, better image resolution and quality is provided while the rate of production is increased due to the reduced exposure time.

The developer composition of the invention can comprise components in addition to those described above. Such other components include, for example, dyes, additional wetting agents, buffers, and others known to the skilled of the art. However, while such additional components can comprise metal ions, the preferred embodiments of the invention are metal ion-free. It is a significant advantage of such preferred embodiments that work pieces, such as integrated circuit devices, are not contaminated by metal ions from the developer composition. In this regard, the metal ion-free developer compositions according to such preferred embodiments are especially advantageous for use with automated, in-line developing methods in which there is no rinse of the reverse side of the device after development of the photomechanical image. Often in such applications, a portion of the developer solution is not rinsed away and ion contamination of the device results. However, if metal ion-free developer according to the present invention is employed, such unrinsed developer will not cause metal ion contamination of the work piece.

Accordingly, not only is there increased speed of production and improved quality, there is also the elimination of metal ion contamination and consequent device failure.

The following examples will illustrate the invention and is not intended to be taken as a limitation thereof.

EXAMPLE I

A photoresist developer composition according to the invention was prepared as follows: to 14706 ml of deionized water was added 1000 gm of tetramethylammonium hydroxide. Next was added 511 ml of glycerol. Next was added 7.125 gm of active ETHOQUAD C/12 (Armak Co.). Finally, an additional 10,000 ml of deionized water was added. The above was mixed for half an hour and was ready for dilution to suit the desired processing conditions. The pH of this solution was measured at 12.8.

EXAMPLE II

The speed and selectivity of the instant developer composition was compared to that of known developers. Silicon wafers, each of 3 inches diameter, were coated with AZ 1470 photoresist (Shipley Company Inc., Newton, Mass.) at a thickness of 1.4/u. The coated wafers were exposed with 45 millijoules cm$^{-2}$ energy from actinic radiation source through a graduated density stepfilter. The wafers, 3 each, were immersion developed for 20 seconds in 1 of 4 developer solutions and immersion rinsed in deionized water for 60 seconds and then blown dry with N$_2$. The first 3 solutions were separate batches of developer solution made according to the method of Example I. The fourth batch was (MF 312) Developer (Shipley Company Inc., Newton, Mass.) prepared by mixing 3 parts developer and 2 parts deionized water, and used according to directions. All solutions were used at 22.5° C. Following development, the resist layers were again measured for thickness to determine selectivity, that is, the amount of loss of unexposed resist, and visually examined to determine the percent transmission needed for complete development. The results are tabulated below:

TABLE I

| Developer Solution | Energy Transmitted For Step Clearance. Identical | Resist Thickness Loss (Å) |
|---|---|---|
| Batch 1 | 22.5 | 500 |
| " | " | 500 |
| " | " | 600 |
| | | Avg. 533Å |
| Batch 2 | " | 500 |
| " | " | 450 |
| " | " | 450 |
| | | Avg. 467Å |

TABLE I-continued

| Developer Solution | Energy Transmitted For Step Clearance. Identical | Resist Thickness Loss (Å) |
|---|---|---|
| Batch 3 | " | 500 |
| " | " | 400 |
| " | " | 400 |
| | | Avg. 433Å |
| MF 312 | 48.0 | 1,000 |
| " | " | 1,100 |
| " | " | 950 |
| | | Avg. 1,017Å |

The results for the three batches of the metal ion-free developer of the invention are consistent within experimental error. The test results show that the metal ion-free developer is approximately 2.1 times faster, that is, requires 2.1 times less exposure energy, than the MF 312 developer used as a control.

Moreover, regarding selectivity, visual composition of the wafers under a microscope revealed that each batch of the metal ion-free developer of the invention had virtually no effect on the photoresist receiving less than approximately 18 to 20% transmission. Thus, unless having received at least about 22.5% transmission and being developed completely, the photoresist was unattacked by the developer. By comparison, photoresist developed with MF 312 which received less than the 48% transmission needed for complete development, over a broad range down to 1.0% was attacked by the developer to a significant extent.

EXAMPLE III

Metal ion-free developer according to Example I (herein "MIF") was diluted to 5 parts developer and 1 part D.I. water and compared to a known developer MF 312 (a standard Shipley product) at a dilution of three parts developer to two parts deionized water over a temperature range from 14° C. to 26° C. Selectivity was measured as the loss of unexposed resist.

Twenty-eight (28) wafers, each 3 inches diameter, were spin coated with 1.50u AZ 1470 photoresist (Shipley Company Inc., Newton, Mass.) at 2500 RMP. The coated wafers were exposed to actinic radiation of 45 millijoules cm$^{-2}$ through a step mask. Following exposure the wafers were immersion developed for 20 seconds and then immersion rinsed in deionized water for 60 seconds. The results are tabulated below:

TABLE III

| Developer Solutions | Temperature (°C.) | Thickness Loss | % Energy Transmitted To Clear Two Identical Step |
|---|---|---|---|
| MIF | 14 | 0.02 | 25 |
| MIF | 14 | 0.02 | 25 |
| MF 312 | 14 | 0.05 | 50 |
| 312 | 14 | 0.05 | 50 |
| MIF | 16 | 0.02 | 25 |
| MIF | 16 | 0.02 | 25 |
| 312 | 16 | 0.05 | 50 |
| 312 | 16 | 0.05 | 50 |
| MIF | 18 | 0.05 | 25 |
| MIF | 18 | 0.05 | 25 |
| 312 | 18 | 0.08 | 50 |
| 312 | 18 | 0.08 | 50 |
| MIF | 20 | 0.05 | 22 |
| MIF | 20 | 0.05 | 22 |
| 312 | 20 | 0.10 | 50 |
| 312 | 20 | 0.10 | 50 |
| MIF | 22 | 0.05 | 20 |
| MIF | 22 | 0.05 | 20 |
| 312 | 22 | 0.10 | 50 |

TABLE III-continued

| Developer Solutions | Temperature (°C.) | Thickness Loss | % Energy Transmitted To Clear Two Identical Step |
|---|---|---|---|
| 312 | 22 | 0.10 | 50 |
| MIF | 24 | 0.05 | 20 |
| MIF | 24 | 0.05 | 20 |
| 312 | 24 | 0.10 | 50 |
| 312 | 24 | 0.10 | 50 |
| MIF | 26 | 0.05 | 20 |
| MIF | 26 | 0.05 | 20 |
| 312 | 26 | 0.10 | 45 |
| 312 | 26 | 0.10 | 45 |

MIF dilution was
5 parts developer
1 parts DI water
MF312 dilution at
3 parts developer
2 parts DI water The results show that the metal ion-free developer of the solution is more than twice as fast, that is, requires less than one half the exposure energy as the MF312 Developer. It is also shown that the metal ion-free developer is more than twice as selective, causing less than one half the loss of unexposed resist. It was also observed that the metal ion-free developer provided far superior image resolution.

We claim

1. An aqueous metal ion-free developer composition for developing an image in an exposed photoresist consisting essentially of a mixture of a metal ion-free alkali hydroxide as a source of alkalinity and a metal ion-free surfactant, said source of alkalinity being a lower alkyl quaternary ammonium hydroxide and said surfactant being one or more quaternary ammonium compounds that differs from the alkali hydroxide, but conforms to the general formula:

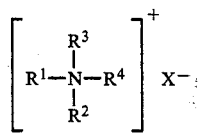

wherein
$R^1$ is a saturated or unsaturated, straight or branched chain hydrocarbon having from 6 to 20 carbon atoms, and from 0 to 3 atoms, provided that each oxygen atom is separated from another by at least one carbon atom, and which is alkoxy substituted or unsubstituted;
$R^2$ and $R^3$ are the same or different where each is selected from the group of alkyl having from 1 to 3 carbon atoms and $(R^5O)_nH$, wherein $R^5$ is alkylene having from 1 to 3 carbon atoms and n is an integer of from 1 to 20; or $R^2$ and $R^3$ together is a member selected from the group of a cycloaliphatic hydrocarbon having from 2 to 8 carbon atoms with from 0 to 2 heteroatoms selected from the group consisting of O, N, and S, provided that each heteroatom is separated from another heteroatom and from the quaternary nitrogen by at least one carbon atom; and a cycloaromatic hydrocarbon having from 2 to 8 carbons with from 0 to 2 nitrogen heteroatoms, provided that each nitrogen is separated from another and from the quaternary nitrogen by at least 1 carbon atom;
$R^4$ is a member selected from the group of a saturated or unsaturated, straight or branched hydrocarbon having from 1 to 10 carbon atoms; $(R^5O)_nH$ as defined above; phenalkyl, wherein the alkyl moiety has from 0 to 3 carbon atoms; and

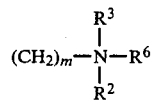

where m is an integer of from 1 to 4, $R^2$ and $R^3$ are as defined above, and $R^6$ is a saturated, straight or branched hydrocarbon having from 1 to 10 carbon atoms or $(R^5O)_nH$ as defined above; and
X is a member selected from the group of halo, hydroxy, silicate, and the corresponding amino oxide of said quaternary ammonium compounds;
said alkali being present in sufficient quantity to provide a photoresist developer having a pH of at least 11 and said surfactant being present in a quantity sufficient to reduce the exposure energy required to form a latent image in a photoresist by at least 20 percent compared to said developer free of said surfactant.

2. The developer composition of claim 1 wherein the alkali comprises tetramethylammonium silicate.

3. The developer composition of claim 1 where the quaternary ammonium hydroxide is a tetraalkyl ammonium hydroxide.

4. The developer composition of claim 3 wherein
$R^1$ comprises a saturated or unsaturated straight or branched hydrocarbon having from 6 to 20 carbon atoms;
$R^2$ and $R^3$ are the same or different and each comprises alkyl of from 1 to 3 carbons or $(R^5O)_nH$ wherein $R^5$ is alkylene of 1 to 3 carbons and n is an integer from 1 to 20;
$R^4$ comprises a saturated or unsaturated, straight or branched hydrophobic hydrocarbon having from 6 to 20 carbon atoms; $(R^5O)_nH$ as defined above; or phenalkyl, wherein the alkyl moiety has from 0 to 3 carbons; and
X comprises halo, oxide, hydroxide or silicate.

5. The developer composition of claim 3 where $R^4$ conforms to the formula:

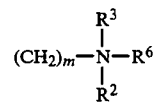

wherein $R^2$ and $R^3$ are as above defined, m is an integer of from 1 to 4 and $R^6$ is a saturated or unsaturated, straight or branched chain hydrocarbon having from 1 to 10 carbon atoms.

6. The developer composition of claim 3 where each alkyl substitutent of the tetraalkyl ammonium hydroxide is the same or different and has from 1 to 3 carbons.

7. The developer composition of claim 6 wherein the tetraalkyl ammonium hydroxide is tetraalkyl ammonium hydroxide.

8. The developer composition of claim 3 wherein said surfactant comprises ethoxylated quaternary ammonium salts having the general formula:

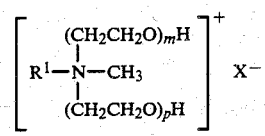

wherein $R^1$ is alkyl of from 8 to 18 carbons in approximately the following proportions:

| $R^1$ carbon chain length | % |
|---|---|
| $C_8$ | 5 |
| $C_{10}$ | 6 |
| $C_{12}$ | 51 |
| $C_{14}$ | 19 |
| $C_{16}$ | 9 |
| $C_{18}$ | 5 | m and p are integers from 1 to 20; and X is defined in claim 1.

9. The developer composition of claim 8 wherein said surfactant comprises methylbis (2-hydroxyethyl) cocoammonium chloride.

10. The developer composition of claim 3 wherein said surfactant comprises quaternary ammonium salts of the formula:

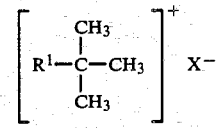

and $R^1$ is alkyl of from 8 to 18 carbons in approximately the following proportions:

| $R^1$ carbon chain length | % |
|---|---|
| $C_8$ | 5 |
| $C_{10}$ | 6 |
| $C_{12}$ | 51 |
| $C_{14}$ | 19 |
| $C_{16}$ | 9 |
| $C_{18}$ | 5 |

11. The developer composition of claim 10 wherein said surfactant comprises trimethyl cocoammonium chloride.

12. The developer composition of claim 3 consisting essentially of a suitable polyhydric wetting agent.

* * * * *